(12) United States Patent
Dickens

(10) Patent No.: US 8,866,517 B2
(45) Date of Patent: Oct. 21, 2014

(54) POWER SYSTEM DATA ACQUISITION SYSTEMS

(75) Inventor: Richard T. Dickens, West Des Moines, IA (US)

(73) Assignee: Mehta Tech, Inc., Eldridge, IA (US)

( * ) Notice: Subject to any disclaimer, the term of this patent is extended or adjusted under 35 U.S.C. 154(b) by 19 days.

(21) Appl. No.: 13/484,091

(22) Filed: May 30, 2012

(65) Prior Publication Data

US 2013/0285716 A1    Oct. 31, 2013

Related U.S. Application Data

(60) Provisional application No. 61/640,252, filed on Apr. 30, 2012.

(51) Int. Cl.
*H03L 7/00* (2006.01)

(52) U.S. Cl.
USPC ............... 327/141; 327/9; 327/33; 327/156

(58) Field of Classification Search
USPC ............... 327/141, 144–163; 331/15–17; 375/373–376
See application file for complete search history.

(56) References Cited

U.S. PATENT DOCUMENTS

| | | | |
|---|---|---|---|
| 4,527,145 A | 7/1985 | Haussmann et al. | |
| 6,614,296 B2 * | 9/2003 | Casper | 330/9 |
| 7,888,973 B1 * | 2/2011 | Rezzi et al. | 327/105 |
| 2006/0217907 A1 | 9/2006 | Long | |
| 2007/0188206 A1 | 8/2007 | Lee | |
| 2008/0252339 A1 | 10/2008 | Corcelli | |
| 2011/0090998 A1 * | 4/2011 | Zhang | 375/365 |
| 2012/0038378 A1 | 2/2012 | Yoda | |

OTHER PUBLICATIONS

International Search Report and Written Opinion, PCT/US2013/038848, Sep. 17, 2013.

* cited by examiner

*Primary Examiner* — Brandon S Cole

(74) *Attorney, Agent, or Firm* — Krieg DeVault LLP

(57) ABSTRACT

A system comprising an interface configured to condition a signal associated with a power system; a clock module configured to generate a synchronization signal; and a module coupled to the interface and configured to digitize the signal from the interface; filter the digitized signal; and generate a time-shifted, digitized signal in response to the filtering and the synchronization signal.

19 Claims, 6 Drawing Sheets

POWER SYSTEM DATA ACQUISITION SYSTEMS

CROSS-REFERENCE TO RELATED APPLICATIONS

This application claims the benefit of U.S. Patent Application No. 61/640,252 filed Apr. 30, 2012, the contents of which are incorporated herein by reference.

BACKGROUND

Embodiments relate to power system data acquisition systems and, in particular, to event recording in power systems.

The Institute of Electrical and Electronics Engineers (IEEE) Standard for Synchrophasors for Power Systems (IEEE Std. C37.118.1-2011) establishes requirements for accuracy of synchronized phasor measurements in electric power systems. A phasor measurement unit (PMU) must maintain a total vector error (TVE) in a phasor measurement below a specified maximum. However, errors in synchronization, delays in processing, or the like can increase a likelihood of exceeding the TVE maximum. For example, in a 60 Hz power system, a time error of +/−26 μs, without an magnitude errors, can result in a TVE exceeding the specified maximum amount.

BRIEF DESCRIPTION OF THE DRAWINGS

The description herein makes reference to the accompanying drawings wherein like reference numerals refer to like parts throughout the several views, and wherein.

DETAILED DESCRIPTION

Embodiments will be described with reference to the drawings. Although particular embodiments will be described, the scope of the following claims is not limited to these embodiments. In contrast, alterations, modifications, combinations, or the like can be made.

Figure 1:
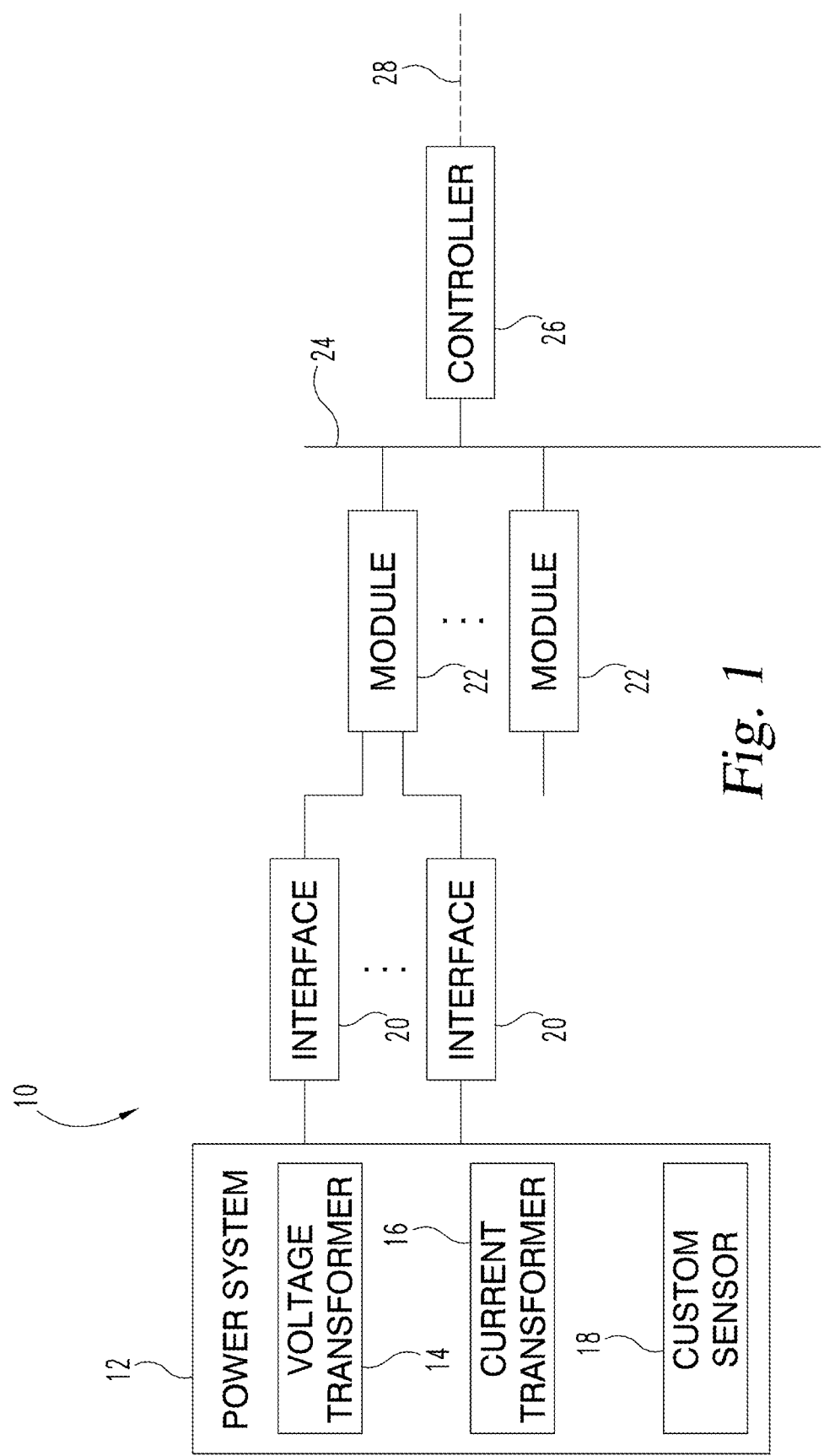
FIG. 1 is a block diagram illustrating a power system data acquisition system according to an embodiment.

FIG. 1 is a block diagram illustrating a power system data acquisition system according to an embodiment. In this embodiment, a data acquisition system 10 is coupled to a power system 12. The power system 12 can include voltage transformers 14, current transformers 16, or other custom sensors 18. Circuit breakers, power generators, transformers, temperature sensors, or other components can be part of the power system 12.

The system 10 includes interfaces 20 for such power system components. Two interfaces 20 are illustrated as coupled to the power system 12, however, any number of interfaces can be present. The interfaces 20 can include isolation circuitry, step-down transformers, input protection, transducers, or other circuitry to condition a signal associated with component of the power system 12 to prepare for digitization. An interface 20 can be coupled to one or more power system component.

The system 10 can include one or more modules 22. Each module 22 can be coupled to one or more interfaces 20. A module 22 can be configured to digitize the signal from the interface 20 and filter the digitized signal. In particular, the module 22 can be configured to generate a time-shifted, digitized signal. In this embodiment, the system 10 includes two modules 22; however, any number of modules 22 can be present. Moreover, only one module 22 is illustrated as being coupled to interfaces 20; however, each module 22 can be coupled to any number of interfaces 20.

The modules 22 are coupled to a communication medium 24. For example, the communication medium 24 can be a network, backplane, bus, or the like. A controller 26 can be coupled to the communication medium 24 and be configured to communicate with the modules 22. The controller 26 can be configured to communicate through an interface 28 to other systems outside of the data acquisition system 10.

As will be described in further detail below, through filtering, a time shift can be introduced into the digitized signal that can be a non-integer multiple of a sample period used for digitization. In addition, the signal from the interface can be scaled to allow for full use of a range of the digitized signal. In an embodiment, such signal processing can be performed substantially independently for each signal associated with each interface 20. In other words, measurement of different, contemporaneous events with different propagation delays and ranges can be substantially synchronized and digitized with improved accuracy.

Figure 2:
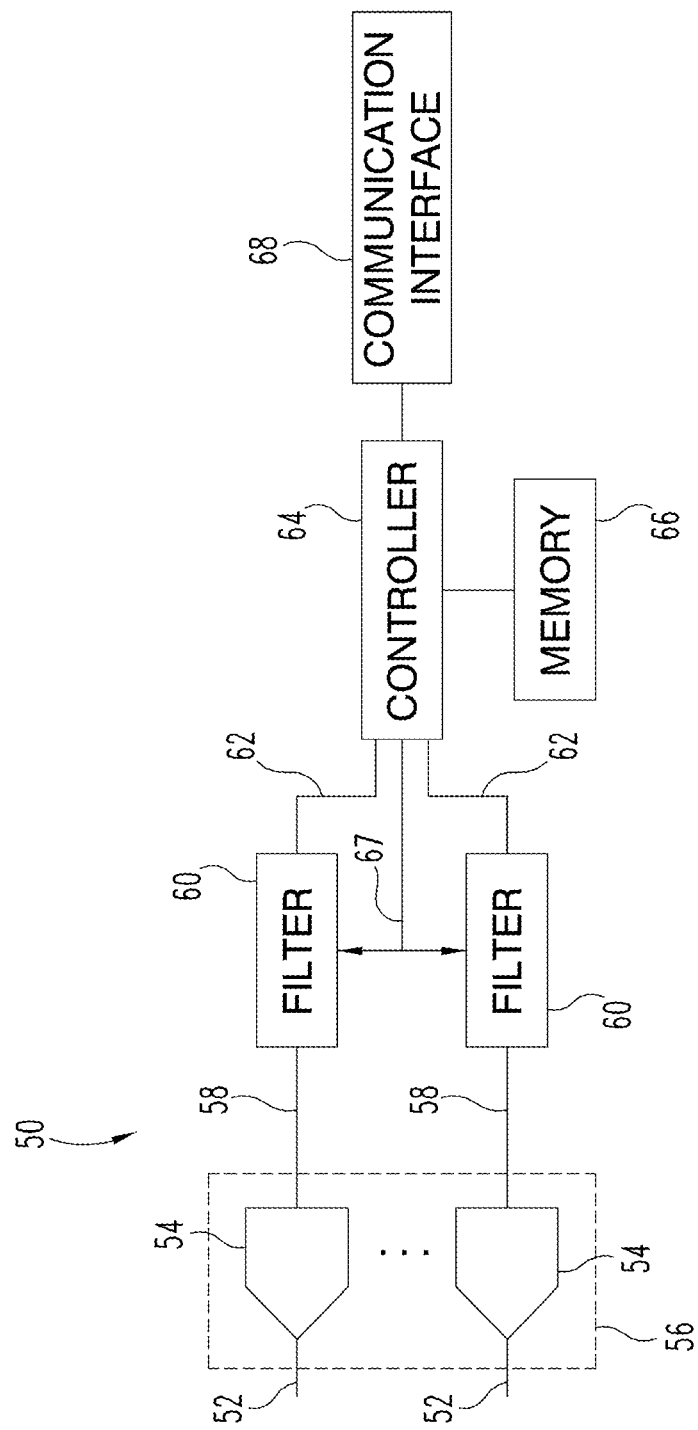
FIG. 2 is a block diagram illustrating a module of a power system data acquisition system according to an embodiment.

FIG. 2 is a block diagram illustrating a module of a power system data acquisition system according to an embodiment. The module 50 is configured to receive input signals 52. For example, the input signals 52 can be signals from the interfaces 20 described above.

Digitizers 54 are configured to digitize the input signals 52. Although only two digitizers are illustrated, any number of digitizers can be present. In addition, each input signal 52 can, but need not be associated with a dedicated digitizer 54. For example, a multi-channel digitizer 56 can include a multiplexer front-end that can selectively route input signals 52 to one or more digitizers 54. However, substantially independent digitized signals 58 can be generated corresponding to the input signals 52.

Each digitized signal 58 can be filtered by a corresponding digital filter 60. A controller 64 can be configured to store the filtered signals 62 in a memory 66, transmit the signals over a communication interface 68.

In an embodiment, a calibration time for an associated input can be stored in the memory 66. For example, when a module 50 is installed in a system 10 of FIG. 1, a digitizer 54 can be coupled to an interface 20 to receive an input signal 52 from that interface 20. Another digitizer 54 can be coupled to a different interface 20. A calibration time for each signal path can be established so that substantially contemporaneous events in the power system 12 result in substantially contemporaneous digitized signals 62 after the respective calibration times are applied.

In an embodiment, the calibration times for the various inputs can be used to align the digitized signals in time to an external reference signal. For example, a sample clock can be substantially synchronized with a global positioning system (GPS) clock, Inter-range Instrumentation Group (IRIG) signal, a related reference signal, or the like. That is, not only can differences in the relative delay times between when events associated with different inputs occur and when the events are digitized be substantially eliminated, but the differences in delay times relative to the reference clock can be substantially eliminated as well. However, in other embodiments, the calibration times can, but need not accommodate for the entire difference in delay between an event and a reference signal. For example, the calibration times can accommodate a difference in delay between events and an internal reference signal. Subsequent processing can accommodate a difference between the internal and external reference signals.

As will be described in further detail below, the filter 60 can be configured to implement the calibration time and/or scale the digitized signal 58. In an embodiment, the filter 60 is configured to scale the digitized signal 58 to allow use of a full range of the digitized signal.

The controller 64 is coupled to the communication interface 68. The communication interface 68 can be an interface suitable to couple the module 50 to the communication medium 24 described above.

Although the digitizers 54 have been described as receiving the input signals 52, other circuitry can be present between a digitizer 54 and the interface to the module 50 for the input signals 52. For example, input protection, attenuators, amplifiers, filters, or the like can be present.

Figure 3:
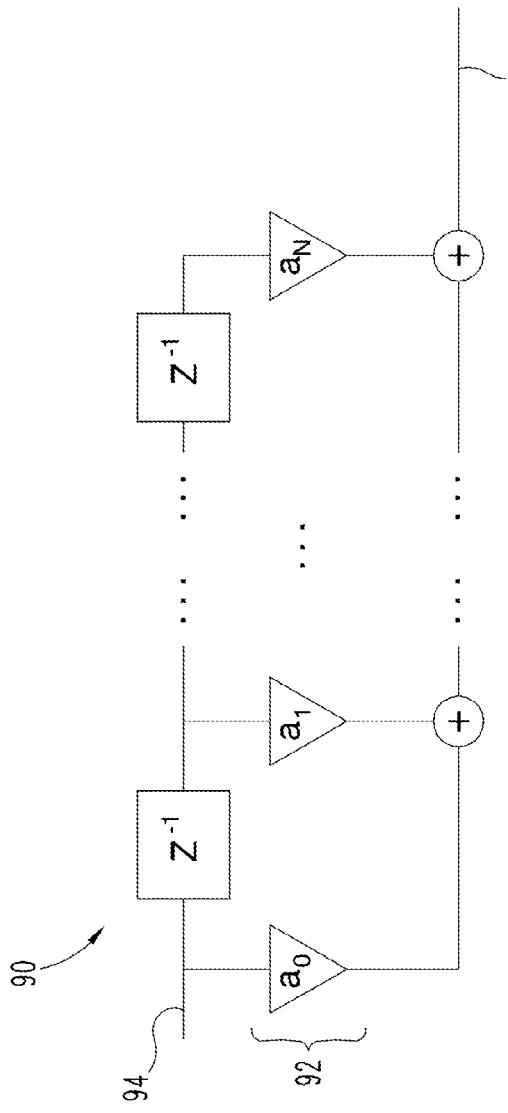
FIG. 3 is a block diagram illustrating a digital filter according to an embodiment.

FIG. 3 is a block diagram illustrating a digital filter according to an embodiment. Referring to FIGS. 2 and 3, in this embodiment, a finite impulse response (FIR) filter 90 is an example of the digital filter 60. The filter 90 has coefficients 92 $a_0$ through $a_N$. The coefficients 92 can implement a FIR filter to filter an input signal 94 to generate an output signal 96.

In an embodiment, initial coefficients are determined for a desired filter shape. The coefficients can be integer coefficients. The coefficients can be scaled up such that a largest coefficient has a magnitude greater than or equal to one half of a maximum magnitude of a coefficient. For example, using an 8 bit signed integer for coefficients, an initial coefficient set can be 43, 16, and 2. The coefficients can be scaled up by multiplying the coefficients by a constant, logically left shifting the coefficients, or the like. Using logically left shifting as an example, left shifting the coefficients by one bit results in coefficients of 86, 32, and 4. For an 8 bit signed integer, a maximum magnitude is 127 and one half is approximately 64. Thus, logically shifting the coefficients results in at least one coefficient, namely 86, being greater then 64, or one half of the maximum magnitude. In an embodiment, the initial coefficients can be stored in the memory 66 and shifted by the controller 64. In another embodiment, the shifted coefficients can be stored in the memory 66. In another embodiment, the stored coefficients can be selected such that the initial coefficients have at least one coefficient that is greater than one half of a maximum magnitude.

Although signed integers have been used as examples of coefficients, the coefficients can represent other types of numbers. For example, the coefficients can represent fractional fixed point numbers within a range. An example of a range is from −1 to +1. Moreover, although integers and fixed point numbers have been described, the coefficients can also be represented by floating point numbers as desired.

Regardless, the coefficients, can be scaled down according to a desired range of sensed values. For example, during a calibration a range of sensed values, when digitized, could correspond to a range greater than the full range available using the scaled up coefficients described above. The coefficients can be scaled down to appropriately scale the filtered signal 96. That is, with the coefficients scaled up as described above, a given input signal range may result in overflows. Accordingly, the coefficients can be scaled down so that a particular range of sensed values is fully contained within the range of the filtered signal 96.

In an embodiment, the memory 66 can be configured to store a maximum sensed value. The controller 64 is configured to scale the filter coefficients such that when the maximum sensed value is filtered by the digital filter, an output of the digital filter is less than a maximum output magnitude of the digital filter.

Although a maximum sensed value has been given as an example, other parameters can be stored to represent a scale factor for the digital filter 90. For example, a raw scale factor can be stored. The raw scale factor can be a value such that when the scaled up coefficients are multiplied by or divided by the raw scale factor, the resulting coefficients are the coefficients that result in a desired scaling for a desired input range.

When the filter 90 is used as the filter 60, each digitized signal 58 can be independently scaled as desired. Thus, a given module can be configurable to receive different types of signals having different ranges.

Figure 4:
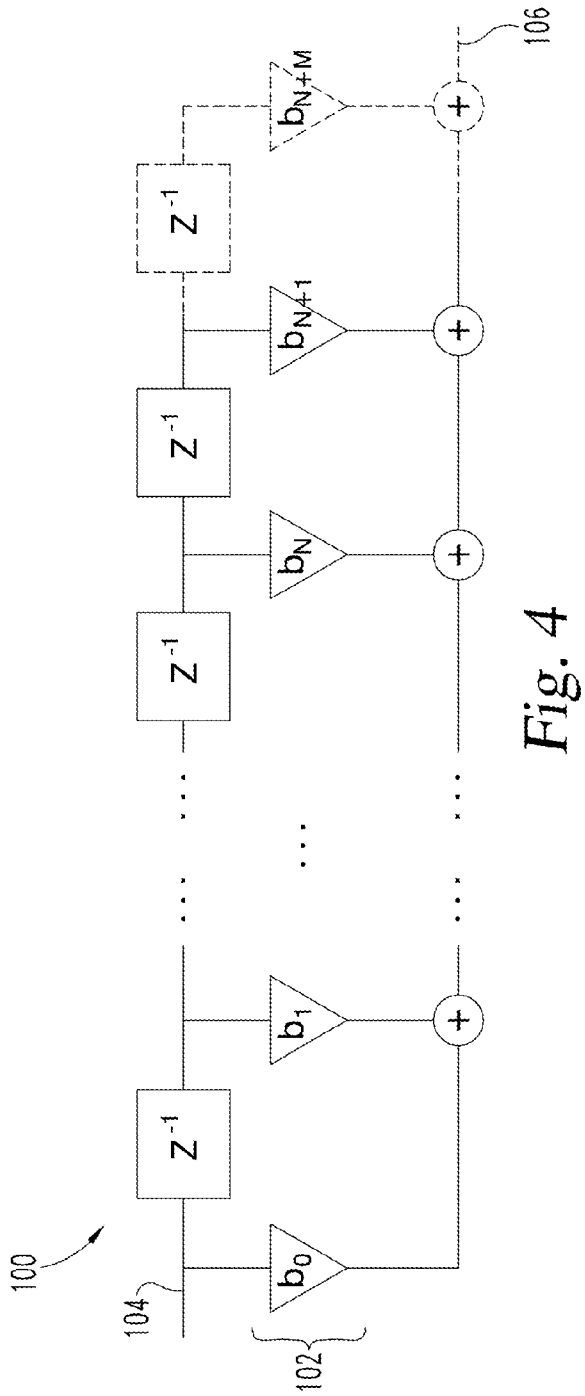
FIG. 4 is a block diagram illustrating a digital filter according to another embodiment.

FIG. 4 is a block diagram illustrating a digital filter according to another embodiment. In an embodiment, filter coefficients can be calculated for a digital filter in response to a calibration time. The calibration time can be used to shift a sampled signal in time relative to a sample clock. Filter 100 includes coefficients 102 $b_0$ through $b_{N+M}$.

In an embodiment, the memory 66 can be configured to store a calibration time that is a fraction of a sample period. Coefficients 102 can be generated from filter coefficients 92 to generate a time-shifted output. The time shifting can be created by appropriately creating the coefficients 102 to maintain the filtering of the digital filter 90, but introducing a time shift.

For example, to achieve the interpolation, M additional stages can be used as in the filter 100. Using linear interpolation as an example, one additional stage, or M=1, can be used. A factor $\alpha$ can represent a fraction of a sample period. Using a two stage filter 90 with coefficients $a_0$ and $a_1$, the coefficients 102 can be calculated with equations 1-3.

$$b_0 = a_o(1-\alpha) \quad (1)$$

$$b_1 = a_1(1-\alpha) + a_0\alpha \quad (2)$$

$$b_2 = a_1\alpha \quad (3)$$

Accordingly, coefficients 102 can be calculated for filter 100 that effectively shift the filtered signal in time by a fraction of a sample period. Although two filter coefficients have been used as an example for coefficients 92, any number N+1 coefficients can be used to generate N+2 coefficients 102 for shifting in time by a fraction of the sample period.

In an embodiment, a delay of a non-integer multiple of the sample period can be introduced. That is, the delay can be greater than one sample period, but still have a granularity that is less than a sample period. For example, a delay can be 3.5 times the sample period. To achieve the desired delay range, additional delay stages can be introduced. Thus, the filter 100 will have that many more stages and/or coefficients 102. That is, one additional stage in filter 100 a compared to filter 90 allows for a delay from 0 to 1 times the sample period. M additional stages allows for a delay from 0 to M times the sample period. The number M additional stages can be selected to achieve the desired range for adjustment. Using the example of a desired delay of 3.5 times the sample period, M=4 additional stages can be used.

In an embodiment, the controller 64 can be configured to calculate the coefficients 102 in response to the coefficients 92 and the calibration time. That is, the coefficients of the filter 90 can be stored in the memory 66. The controller 64 can receive a calibration time, for example, after installation in the field. The controller 64 can be configured to generate coefficients 104 for the digital filter 100 in response to the calibration time and the coefficients 92.

The controller 64 can be configured to calculate the coefficients 102 in a variety of ways. In an embodiment, the controller 64 is programmed with equations to calculate each of the coefficients 102 in response to the coefficients 92 and a calibration time. Using the example of equations 1-3 above, the controller 64 can be configured to convert the calibration time into $\alpha$. The controller 64 can then calculate the coefficients 102.

In another embodiment, the memory 66 is configured to store coefficients of an interpolation filter. Using the example above, coefficients of an interpolation filter are represented by equations 4 and 5:

$$c_0 = (1+\alpha) \quad (4)$$

$$c_1 = \alpha \quad (5)$$

The coefficients $c_0$ and $c_1$ can be convolved with the coefficients 92 $a_0$ through $a_N$. That is, the controller 64 is configured to calculate coefficients of the interpolation filter in response to a calibration time. The controller 64 is configured to then convolve the recently calculated interpolation filter coefficients with the initial filter coefficients to generate the coefficients 102 of the filter 100.

In an embodiment, regardless of how obtained, the filter 100 can be created that can scale and time shift an input signal. As a result, input signals 52 can be substantially synchronized and normalized in a data acquisition system 10.

Although multiple sequential coefficients have been described above, that is, N+1 coefficients 92 or N+M+1 coefficients 102, a digital filter can be used that does not use only unit delay functions. For example, a N+1-th order filter of FIG. 3 can be implemented with less than N+1 coefficients.

Furthermore, although linear interpolation has been described as a technique to obtain a filtered value between two samples, other interpolation techniques can be used. For example, a cubic interpolation technique can be used. Using a technique described above, coefficients $c_0$ through $c_3$ can be created for a cubic interpolation filter and convolved with coefficients 92. Alternatively, equations can be created to calculate the coefficients $b_0$ through $b_{N+3}$ in response to a calibration time.

Moreover, although the filter that implements the interpolation can be a linear phase filter, a non-linear phase filter can be used. In addition, the filter that implements the interpolation can, but need not be an all pass filter.

Figure 5:
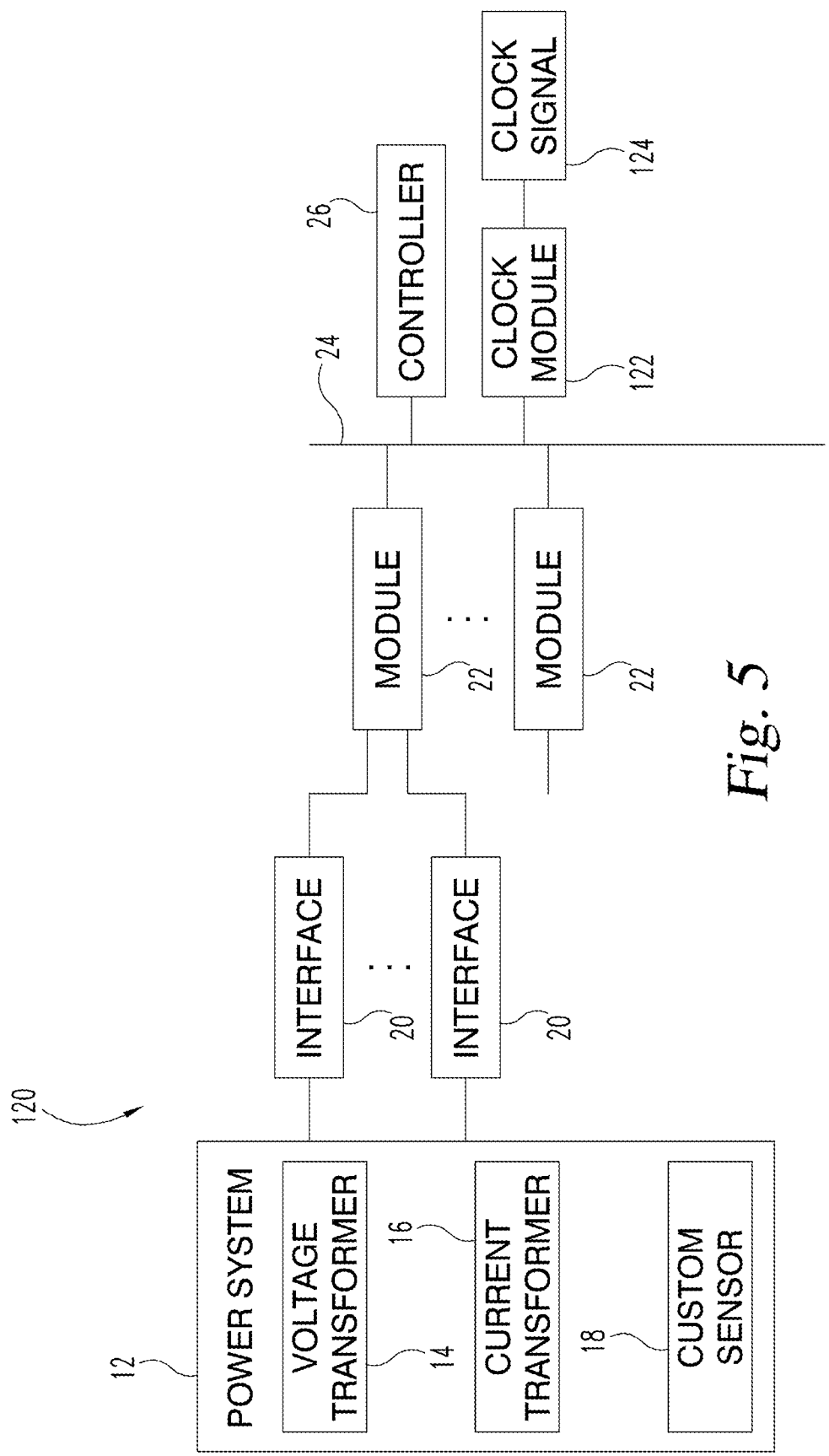
FIG. 5 is a block diagram illustrating a power system data acquisition system according to another embodiment.

FIG. 5 is a block diagram illustrating a power system data acquisition system according to another embodiment. In this embodiment, the system 120 includes a clock module 122 configured to receive a clock signal 124. The clock module 122 is configured to generate a synchronization signal in response to the clock signal 124.

The clock module 122 is coupled to the communication medium 24 and can transmit the synchronization signal through the communication medium 24. The modules 22 are configured to receive the synchronization signal. In response the modules 22 are configured to generate a time-shifted, digitized signal. That is, the modules 22 can create digitized signals representing aspects of the power system 12 that can be calibrated in time internal to a single module 22. Multiple modules can be synchronized to the synchronization signal. As a result, the digitized signals can be synchronized both across modules 22 and to an external reference, such as the clock signal 124.

Figure 6:
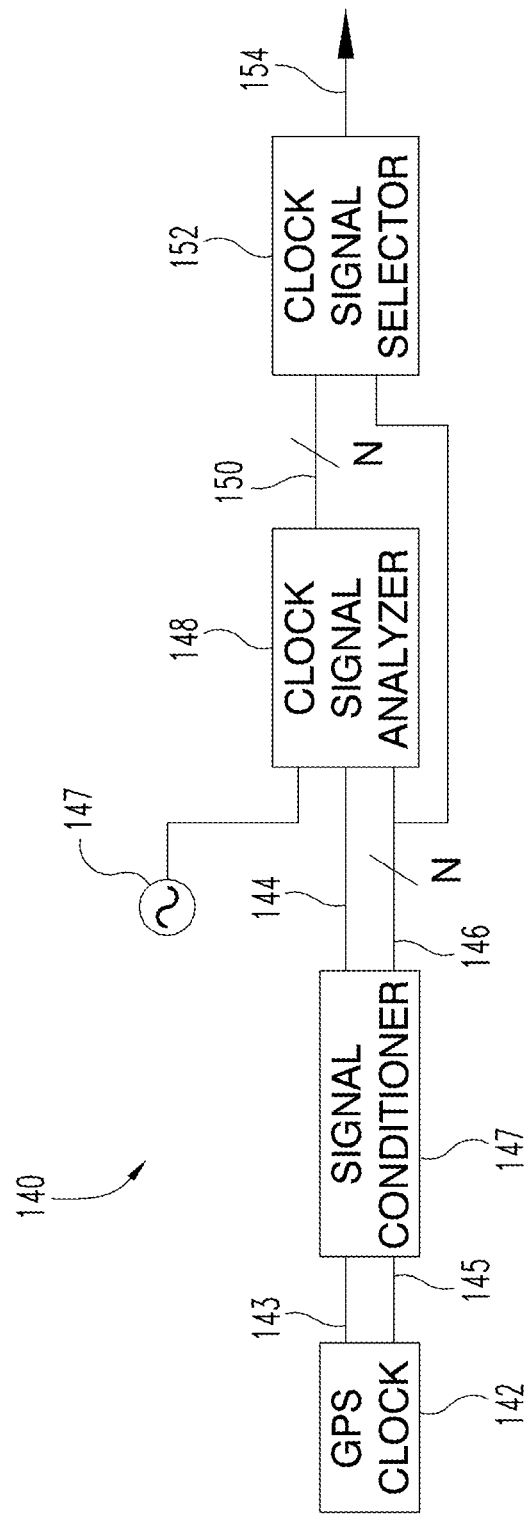
FIG. 6 is a block diagram illustrating a clock signal generator according to an embodiment.

FIG. 6 is a block diagram illustrating a clock signal generator according to an embodiment. In this embodiment, the clock signals 143 and 145 can be generated by a global positioning system (GPS) clock 142. For example, the clock signal 143 can be a one-pulse-per-second (1PPS) signal from a GPS clock receiver. The clock signals 145 can be N clock signals, such as Inter-range Instrumentation Group (IRIG) signals.

In an embodiment, the IRIG signals can include IRIG-B signals in different formats. For example, the N clock signals can be a pulse width modulated IRIG-B signal, an amplitude modulated IRIG-B signal, and a Manchester modulated IRIG-B signal. Accordingly, each clock signal 145 will have a reference marker that occurs at 1PPS.

A signal conditioner 149 is configured to first condition the clock signals 143 and 145. For example, the signal conditioner 149 is configured process the clock signals 143 and 145 to remove glitches or other transients that are shorter in time than a threshold. The signal conditioner 149 can have an initial threshold of about 2 microseconds to deglitch the clock signals 143 and 145. This threshold can be set as desired, for example, dependent on the modulation scheme, bit period, or the like. In an embodiment, the clock signals 143 and 145 can be filtered to attempt to remove glitches.

The signal conditioner 149 is also configured to demodulate and/or decode the clock signals 146. For example, the signal conditioner 149 can decode a pulse width modulated IRIG-B signal, demodulate an amplitude modulated IRIG-B signal, and decode a Manchester modulated IRIG-B signal. Accordingly, the clock signals 145 can be transformed into respective time code frames 146.

The clock signal analyzer 148 is configured to receive the time code frames 146 and the conditioned 1PPS signal 144. The clock signal analyzer 148 is configured to analyze these signals to determine a quality of the clock signals represented by the time code frames 146 and conditioned 1PPS signal 144. The clock signal analyzer 148 can generate status signals 150 related to the time code frames 146.

A clock signal selector 152 is configured to receive status signal 150 from the clock signal analyzer 148. The status signals 150 can represent whether an associated time code frames 146 is missing, stable, or the like. Using the status signals 150, the clock signal selector 152 is configured to select a time code frame 146 as an output clock signal 154. In an embodiment, multiple clock signals can be generated from a single clock signal source as output clock signals 154.

Accordingly, a reference clock signal can be selected from among multiple such signals. In addition, the selected clock signal can change in response to changes in stability, period, phase, or the like of the input clock signals. As a result, a more stable clock signal can be generated and, consequently, more accurate measurements. As will be described in further detail below, the clock module 140 can synchronize to signals from a GPS clock 142; however, if the signals from the GPS clock 142 are lost, an accuracy of the output clock signals 154 can be substantially maintained. As a result, phasor measurements will have a greater likelihood of remaining within specified ranges for total vector errors.

In an embodiment, the functionality described can be implemented in a programmable logic device. For example, a field programmable gate array (FPGA) can implement the various functions described herein. However, other devices can be used, such as an application specific integrated circuit, a digital signal processor, discrete components, a general purpose processor, or the like.

Although only one clock source, the GPS clock 142, is illustrated, multiple clock sources can be used. Each clock source can generate corresponding clock signals, such as IRIG signals. Accordingly, the clock signal analyzer 148 can select from among the multiple clock signals from multiple sources for use as the clock signal 154.

Figure 7:
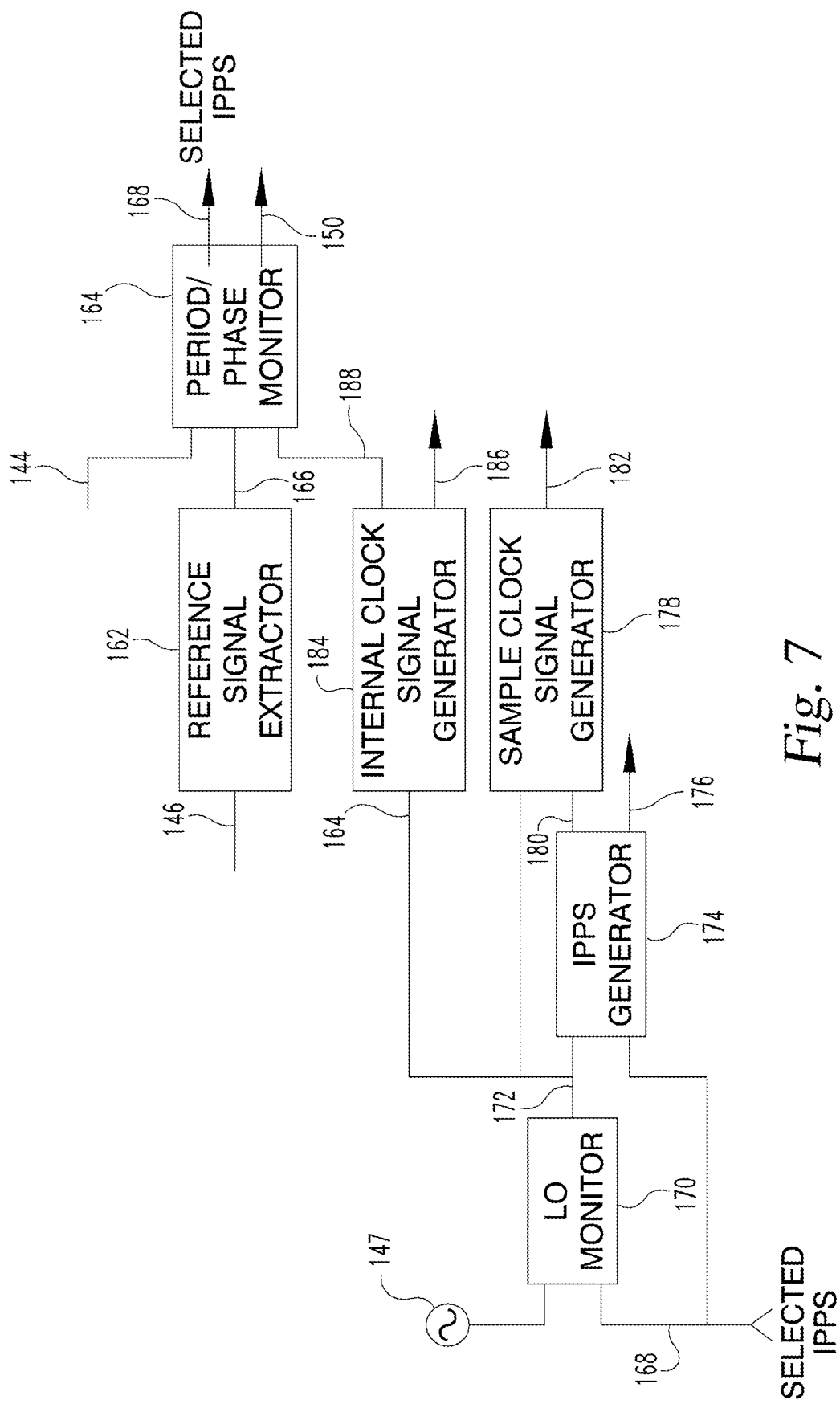
FIG. 7 is a block diagram illustrating an example of a clock signal analyzer of FIG. 6.

FIG. 7 is a block diagram illustrating an example of a clock signal analyzer of FIG. 6. The reference signal extractor 162 is configured to receive the time code frames 146. In IRIG signals, reference markers indicate divisions between time code frames. Within IRIG-B signals, the reference markers occur at a 1PPS rate.

The reference signal extractor 162 is configured to extract these periodic pulse signals from the time code frames 146. In this embodiment, the clock signal analyzer 148 can extract 1PPS signals from the time code frames 146 that are substantially aligned to the reference markers within the respective time code frames 146.

As the clock signals 146 are IRIG-B signals, a 1PPS signal can be extracted from each clock signal 146. For example, once converted into time code frames, position identifiers within the time code frames can be identified to extract the 1PPS signal. In particular, a frame reference marker can be extracted. Accordingly, in this example, four 1PPS signals are available, a 1PPS 144 from the GPS clock 142, and three reference markers 166 from the IRIG-B time code frames 146.

Although a 1PPS reference marker is used as an example, other reference signals can be extracted and used. For example, IRIG-A signals can be used to generate a 10 pulse-per-second signals as reference signals. Subsequent period and phase monitoring can be adjusted accordingly. Furthermore, any number of IRIG signals can be used.

A period and phase monitor 164 is configured to monitor the periods of the reference signals 166. In particular, the clock signal analyzer 148 is configured to determine if a 1PPS signal is out of range. For example, the clock signal analyzer 148 can be configured to store a number of local oscillator 147 cycles that substantially corresponds to one second. For clarity, the connections of the local oscillator 147 have only been illustrated in particular locations; however, the local oscillator 147 signal can be distributed as needed.

The period and phase monitor 164 is configured to count a number of local oscillator 147 cycles for each period of the reference signals 166. For example, a counter that is clocked by the local oscillator 147 can run for each reference signal 166. The reference signal 166 can latch the value and reset the associated counter.

Thus, the number of local oscillator 147 cycles for a period of each reference signal 166 can be compared against the stored number corresponding to one second. In response to the number of cycles of a period of a given reference signal being different from the stored number of cycles by a threshold, the reference signal 166 and the corresponding clock signal can be identified as missing. That is, if the period of the reference signal 166 is not within a range of the stored number, the reference signal 166 can be identified as missing.

Other criteria can be used to determine if a reference signal 166 is missing. For example, a number of periods of the reference signal 166 that are out of range can be used to determine if the reference signal 166 is missing. As described above, the number of periods that the reference signal 166 can be out of range before being characterized as missing is zero. That is, if the reference signal 166 period is out of range once, then it is characterized as missing. However, in another embodiment, a number of consecutive periods where the reference signal 166 period is out of range exceeds a threshold, then the reference signal 166 can be characterized as missing. Accordingly, glitches, transients, or the like can be suppressed.

Another threshold number of periods can be used to determine if a reference signal 166 is present, or not missing. For example, to characterize a reference signals as not missing, the reference signal 166 must be in range for 8 consecutive periods. Although 8 consecutive periods has been used as an example, other thresholds can be used.

In addition to period, a phase of the reference signal 166 can be measured by the period and phase monitor 164. For example, an edge of the 1PPS 144 signal, such as a rising edge, can be used to reset counters associated with the reference signals 166. These counters can be clocked by the local oscillator 147. An edge of the reference signal 166 can be used to latch the count of a counter. Accordingly, the latched value represents the phase difference between the 1PPS signal 144 and the reference signals 166.

From among the 1PPS signals, a single 1PPS signal 168 can be selected. For example, a 1PPS signal from a reference signal 166 that has the most stable periods, stable phase, or the like can be used as the selected 1PPS signal 168.

In addition to evaluating a quality of a reference signal 166, the phase difference between a reference signal 166 and the 1PPS signal 144 can be used if the 1PPS signal 144 is missing. For example, at a time when the 1PPS signal 144 is present, the phases of the reference signals 166 can be measured. The phase of the selected 1PPS signal 168 can be adjusted by the measured phase when the 1PPS signal 144 is missing.

A local oscillator monitor 170 can be configured to monitor the local oscillator 147. The local oscillator monitor 170 is configured to receive the local oscillator 147 signal and the selected 1PPS signal 168. The local oscillator monitor 170 is configured to count cycles of the local oscillator 147 between events of the 1PPS signal 168. The 1PPS signal 168 was selected by the period and phase monitor 164 as the best 1PPS signal. Accordingly, a value of counter that is clocked by the local oscillator 147 and latched by the 1PPS signal 168 will represent a frequency of the local oscillator 147.

In an embodiment, the output of the counter that counts the local oscillator 147 cycles can be low pass filtered. The filtered value can be output as the local oscillator frequency 172. Since the local oscillator frequency 172 was low pass filtered over multiple 1 second periods, the resulting value is a relatively stable representation of the number of local oscillator 147 cycles in a 1PPS period.

A 1PPS signal generator 174 is configured to generate 1PPS signals 176 and 180. In an embodiment, the period and pulse-width of the 1PPS signals 176 and 180 can be set in terms of local oscillator 147 cycles. 1PPS signal generator 174 is configured to synchronize the 1PPS signals 176 and 180 with the selected 1PPS signal 168.

For example, the 1PPS signal generator 174 can be configured to measure a phase delay from the selected 1PPS signal 168 to the 1PPS signal 180. The rising edge of the selected 1PPS signal 168 can clear a counter that is clocked by the local oscillator 147. The rising edge of the 1PPS signal 180 latches the count. If the 1PPS signal 168 is missing the latch is cleared. The 1PPS signal generator 174 is configured to synchronize the 1PPS signal 180 to the selected 1PPS signal 168 by substantially continuously reducing the measured phase error in small steps.

If the selected 1PPS signal 168 is not available then the 1PPS signal 180 is unsynchronized or "free running." The low-pass filtered local oscillator frequency 172 can be used to generate the 1PPS signal 180. As a result, the 1PPS signal 180 can continue running with effectively little drift.

The sample clock generator 178 is configured to generate a sample clock signal 182. The sample clock signal 182 can be generated in response to the local oscillator frequency 172 and a 1PPS signal 180. For example, for a given sample clock 182 frequency, a dividing factor and a remainder can be loaded in the sample clock generator 178. That is, the local oscillator frequency 172 can be divided by the sample clock 182 frequency to generate the dividing factor and the remainder.

A number of cycles of the remainder can be deleted from local oscillator 147 signal when generating the sample clock 182. For example, the frequency 172 of the local oscillator 147 can be divided by the remainder. The result is a period after which a cycle of the local oscillator 147 signal is deleted. Accordingly, the deleted cycles can be spread across the 1PPS period. The local oscillator 147 signal with deleted cycles can be divided by the dividing factor. The rising-edge of the sample clock signal 182 can be synchronized to the an edge of the 1PPS signal 180. The result is the desired sample clock signal 182 at the desired frequency and synchronized with the 1PPS signal 180.

An internal clock signal generator 184 can be configured to generate an internal clock signal 186, such as an internal IRIG signal. In particular, the internal clock signal 186 can be used by the clock signal selector 152 as a clock signal 154 if the other clock signals from the GPS clock 142 are not present. For example, the internal clock signal generator 184 can use data from the IRIG time code frames 146 to create an IRIG-B stream which has its reference mark synchronized to the 1PPS Out signal.

As described above, in an embodiment, signals from GPS Clock 142 can conditioned, processed, measured, and finally used to generate a stable 1PPS signal. This 1PPS signal can be used to generate IRIG-B signals, whether from an external source or internally generated, that are substantially synchronized in phase and frequency with the 1PPS signal. Similarly, sample clock signals can be generated that are substantially synchronized in phase and frequency with the 1PPS signal. Moreover, if the external clock source is lost or interrupted, an internal 1PPS signal can maintain synchronization with a degree of stability. Accordingly, if such external clock sources are lost, a time during which the total vector errors of measurements remain below a specified maximum can be increased. That is the data acquisition system can be more tolerant of input clock signal faults and remain within specified operating requirements.

An embodiment can include a computer readable medium storing computer readable code that, when executed on an appropriately configured computer, causes the computer to perform one or more of the operations described above.

Although particular constants, coefficients, thresholds, or the like have been described as being stored in particular memories, such values can be stored in a variety of locations and communicated to the appropriate device as desired.

While embodiments have been described with reference to the drawings, the sprit and scope of the following claims is not limited to the disclosed embodiments, but on the contrary, is intended to cover various modifications, combinations, and equivalent arrangements. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. An apparatus, comprising:
a digitizer configured to digitize a signal;
a memory configured to store a calibration time, where the calibration time includes a fraction of a sample period of the signal to be digitized; and
a controller configured to:
 calculate filter coefficients for a digital filter in response to the calibration time; and
 filter the digitized signal with the digital filter using the calculated filter coefficients, such that the digitized signal is shifted in time via the filtering by a non-integer multiple of the sample period that is based on the fraction thereof.

2. The apparatus of claim 1, wherein the controller is further configured to offset the filtered signal by a time offset associated with the calibration time and the time offset is greater than one sample period of the digitized signal.

3. The apparatus of claim 1, wherein:
the memory is configured to store a plurality of initial filter coefficients; and
the controller is configured to combine the initial filter coefficients and the calibration time to generate the filter coefficients for the digital filter.

4. The apparatus of claim 1, wherein:
the memory is configured to store a plurality of initial filter coefficients; and
the controller is configured to combine the initial filter coefficients and the calibration time to generate the filter coefficients for the digital filter.

5. The apparatus of claim 1, wherein
the memory is configured to store a plurality of filter coefficients of the digital filter; and
the controller is configured to scale the filter coefficients such that a magnitude of a largest coefficient is greater than or equal to one-half of a maximum magnitude of a coefficient.

6. An apparatus comprising:
a digitizer configured to digitize a signal;
a memory configured to store a calibration time and
a controller configured to:
 calculate filter coefficients for a digital filter in response to the calibration time and
 filter the digitized signal with the digital filter;
wherein
the memory is configured to store a plurality of filter coefficients of the digital filter;
the controller is configured to scale the filter coefficients such that a magnitude of a largest coefficient is greater than or equal to one-half of a maximum magnitude of a coefficient;
the memory is configured to store a maximum sensed value; and
the controller is configured to scale the filter coefficients such that when the maximum sensed value is filtered by the digital filter, an output of the digital filter is less than a maximum output magnitude of the digital filter.

7. A method, comprising:
storing a calibration time that includes a fraction of a sample period for a signal to be digitized;
digitizing the signal;
calculating filter coefficients for a digital filter in response to the calibration time; and
filtering the digitized signal with the digital filter using the calculated coefficients, such that the digitized signal is shifted in time via the filtering by a non-integer multiple of the sample period that is based on the fraction thereof.

8. The method of claim 7, wherein filtering the digitized signal with the digital filter comprises offsetting the filtered signal by a time offset associated with the calibration time and the time offset is greater than one sample period of the digitized signal.

9. The method of claim 7, further comprising:
storing a plurality of initial filter coefficients; and
combining initial filter coefficients and the calibration time to generate the filter coefficients for the digital filter.

10. The method of claim 7, further comprising:
storing a plurality of initial filter coefficients; and
combining the initial filter coefficients and the calibration time to generate the filter coefficients for the digital filter.

11. The method of claim 7, further comprising
storing a plurality of filter coefficients of the digital filter; and
scaling the filter coefficients such that a magnitude of a largest coefficient is greater than or equal to one-half of a maximum magnitude of a coefficient.

12. A method, comprising
storing a calibration time;
digitizing a signal;
calculating filter coefficients for a digital filter in response to the calibration time;
filtering the digitized signal with the digital filter;
storing a plurality of filter coefficients of the digital filter;
scaling the filter coefficients such that a magnitude of a largest coefficient is greater than or equal to one-half of a maximum magnitude of a coefficient;
storing a maximum sensed value; and
scaling the filter coefficients such that when the maximum sensed value is filtered by the digital filter, an output of the digital filter is less than a maximum output magnitude of the digital filter.

13. A system comprising:
an interface configured to condition a signal associated with a power system;
a clock module configured to generate a synchronization signal; and
a module coupled to the interface and configured to:
digitize the signal received from the interface in a sampling period;
filter the digitized signal in a digital filter using filter coefficients calculated in response to a calibration time associated with the interface that includes a fraction of the sampling period; and
generate a time-shifted, digitized signal in response to the filtering and the synchronization signal.

14. The system of claim 13, wherein the module comprises a memory configured to store the calibration time associated with the interface.

15. The system of claim 13, wherein the module is configured to shift the digitized signal by a non-integer multiple of the sample period when filtering the digitized signal.

16. The system of claim 13, wherein:
the interface is one of a plurality of interfaces, each interface configured to condition a corresponding signal associated with the power system; and
the module is coupled to at least two of the interfaces and configured to:
digitize the signals from the interfaces;
filter the digitized signals; and
generate time-shifted, digitized signals in response to the filtering and the synchronization signal.

17. The system of claim 13, wherein:
the module is one of a plurality of modules; and
each module is configured to receive the synchronization signal.

18. The system of claim 13, wherein the interface includes isolation circuitry coupled to a voltage transformer.

19. The system of claim 13, wherein the interface includes isolation circuitry coupled to a current transformer.

* * * * *